United States Patent [19]

Mandai et al.

[11] Patent Number: 5,146,191
[45] Date of Patent: Sep. 8, 1992

[54] DELAY LINE DEVICE AND A METHOD FOR PRODUCING THE SAME

[75] Inventors: Harufumi Mandai; Yoshikazu Chigodo; Atsushi Tojo, all of Kyoto, Japan

[73] Assignee: Murata Manufacturing Co., Ltd., Kyoto, Japan

[21] Appl. No.: 712,546

[22] Filed: Jun. 10, 1991

[30] Foreign Application Priority Data

Jun. 13, 1990 [JP] Japan .................................. 2-156288

[51] Int. Cl.⁵ .............................................. H01P 1/18
[52] U.S. Cl. .................................. 333/161; 333/156; 333/140; 333/33
[58] Field of Search ............... 333/161, 156, 139, 140, 333/246, 164, 33, 177, 219; 336/200, 232, 180; 361/321, 308

[56] References Cited

U.S. PATENT DOCUMENTS

| | | | |
|---|---|---|---|
| 4,949,057 | 8/1990 | Ishizaka et al. | 333/161 |
| 4,999,597 | 3/1991 | Gaynor | 333/246 |
| 5,075,650 | 11/1991 | Okamura et al. | 333/177 |

FOREIGN PATENT DOCUMENTS 1143403 6/1989 Japan .

Primary Examiner—Eugene R. LaRoche
Assistant Examiner—Ali Neyzari
Attorney, Agent, or Firm—Wegner, Cantor, Mueller & Player

[57] ABSTRACT

A delay line device for delaying signal transmission. A lamination comprises an uppermost grounding electrode, a lowermost grounding electrode, a plurality of strip-line conductors, a plurality of intermediate grounding electrodes, dielectric layers, and protective layers. The strip-line conductors and the intermediate grounding electrodes are accumulated alternately and are interposed between the uppermost and the lowermost grounding electrodes. The dielectric layers are each interposed between each adjacent pair of the strip-line conductor and the intermediate grounding electrode. The protective layers are respectively provided on outer surfaces of the uppermost and the lowermost grounding electrodes. The strip-line conductors are connected via a through hole to form a strip-line conductor series and both ends of the series are extended onto a side surface of the lamination. An external input electrode is connected to one of the ends of the strip-line conductor series on the side surface of the lamination. An external output electrode is connected to the other end of the strip-line conductor series on the side surface of the lamination. An external grounding electrode is connected to connecting portions of the uppermost, lowermost and intermediate grounding electrodes on the side surface of the lamination.

15 Claims, 5 Drawing Sheets

DELAY LINE DEVICE AND A METHOD FOR PRODUCING THE SAME

BACKGROUND OF THE INVENTION (1) Field of the Invention

This invention relates to a delay line device for delaying signal transmission in a computer or a measuring apparatus and a method of producing the delay line device, especially to such a delay line device having an excellent frequency characteristic in a high frequency band of 100 MHz or above and a manufacturing method thereof.

(2) Description of the Prior Art

FIG. 1 shows a conventional delay line device having an excellent high frequency characteristic. The delay line device comprises an insulating plate 31, a strip-line conductor 32 formed on an upper surface of the plate 31, a grounding electrode layer (not shown) formed almost all over a bottom surface of the plate 31, a pair of grounding leads 34 connected to the grounding electrode layer, and input and output leads 35 and 36 respectively connected to ends of the strip-line conductor 32. The strip-line conductor 32 is used as a signal line.

In the above construction, extending a delay time requires extending the strip-line conductor. The extended strip-line conductor requires quite a large plate, which prevents the realization of a compact delay line device.

Japanese Patent Publication Kokai No. 1-143403 has disclosed a delay line device which can be compact. As shown in FIG. 2, a plurality of microwave IC boards and a plurality of insulating plates 41, 42 and 43 with no conductor are accumulated alternately. Each microwave IC board comprises an insulating plate 44, 45 or 46, a strip-line conductor 47, 48 or 49 formed on a main surface of the plate 44, 45 or 46 and a grounding electrode (not shown) formed all over the other main surface of the plate 44, 45 or 46. The strip-line conductors 47, 48 and 49 are connected in series via a through hole made of holes 51a, 51b and 51c and another via hole made of holes 51d, 51e and 51f. The total length of the connected strip-line conductors, which acts as a signal line, defines a delay time.

Such a delay line device can be compact due to the serial connection of the strip-line conductors. However, the grounding electrodes are connected by through-holes made of a plurality of holes 52 through 56 of each insulating plate. Since the holes should be made in such an area that have no influence on the electric characteristics of the strip-line conductor, each insulating plate should have an extra area for the holes. Accordingly, the compactness of such a delay line device is limited. Furthermore, strip-shaped leads used as input and output terminals have extra inductances, which deteriorate the high frequency characteristic of the delay line device.

The above delay line device are produced as follows. The baked microwave IC boards and unbaked insulating plates 41 through 43 with no conductor are accumulated alternately and bound with a binder. The binder possibly fluctuates the capacity between the strip-line conductors and the grounding electrodes, which also deteriorates the high frequency characteristic of the delay line device. Moreover, it is difficult to appropriately align the microwave IC boards and the insulating plates in the manner that the boards and the plates are connected easily. Producing the insulating plates and the microwave IC boards with many through-holes is also troublesome.

SUMMARY OF THE INVENTION

Accordingly, this invention has an object of offering a delay line device which can be compact and has an excellent high frequency characteristic.

Another object of this invention is to offer a method of producing such a delay line device, by which grounding electrodes are easily connected and layers constituting the delay line device are easily produced.

In accordance with the features of the present invention, there is provided a delay line device for delaying signal transmission. A lamination comprises an uppermost grounding electrode, a lowermost grounding electrode, a plurality of strip-line conductors and a plurality of intermediate grounding electrodes which are accumulated alternately and are interposed between the uppermost and the lowermost grounding electrodes, dielectric layers each interposed between each adjacent pair of the strip-line conductor and the intermediate grounding electrode, and protective layers respectively provided on outer surfaces of the uppermost and the lowermost grounding electrodes. The strip-line conductors are connected via a through hole to form a strip-line conductor series, and both ends of the strip-line conductor series are extended onto a side surface of the lamination. An external input electrode is connected to one of the ends of the strip-line conductor series on the side surface of the lamination. An external output electrode is connected to the other end of the strip-line conductor series on the side surface of the lamination. An external grounding electrode is connected to connecting portions of the uppermost, lowermost and intermediate grounding electrodes on the side surface of the lamination.

The strip-line conductors, the grounding electrodes and the external electrodes may be formed of a metal selected from a group consisting of copper, silver and a silver-palladium alloy, and the dielectric layers. The protective layers may be formed of ceramics. The strip-line conductors, the grounding electrodes, dielectric layers and the external electrodes may be baked to be integrated into one body.

The grounding electrodes may each have a surface area which is a little smaller than a surface area of a main surface of the dielectric layer, and each intermediate grounding electrode may be cut off at a corner thereof for saving an area of the dielectric layer immediately below the intermediate grounding electrode, the area having a hole.

The dielectric layer immediately below each strip-line conductor may have a hole, and two of the strip-line conductors which are adjacent to each other with one of the grounding electrodes interposed therebetween are electrically connected through a via hole, the via hole being formed of the holes of the dielectric layers interposed between the above two strip-line conductors.

The strip-line conductors may be meandering in accordance with a desirable delay time.

The lamination may comprise another external grounding electrode. In such a case, one of the external grounding electrodes is formed on one of the side surfaces of the lamination together with the external input electrode and the other of the external grounding electrodes is formed on the side surface opposed to the above one side surface together with the external output electrode.

The external electrodes may be formed on the side surfaces of the lamination in the manner that a line connecting the external grounding electrodes and a line connecting the external input electrode and the external output electrode are diagonal.

The strip-line conductors may be spiral.

According to the above construction, the grounding electrodes are connected through the external grounding electrodes provided on a side surface of the lamination. Therefore, the dielectric layers need no space for connecting the grounding electrodes. Each dielectric layer can be at least 3 mm smaller in the area surrounding the strip-line conductor than in the conventional models in which each dielectric layer has many holes for connecting the grounding electrodes.

Owing to the construction wherein the strip-line conductors are connected via a through hole, a broad range of delay times are available with a compact size.

The use of the external electrodes restricts the fluctuation in the delay characteristic in the high frequency band of 100 MHz or above and also enables surface mounting.

Moreover, since the strip-line conductors are totally shielded by the grounding electrodes, the delay line device is hardly affected by the external electromagnetic elements.

The strip-line conductors, the grounding electrodes and the external electrodes, which are formed of copper, silver or a silver-palladium alloy, suppress the resistance. Especially, copper and silver are useful in reducing the loss in the high frequency band.

Also in accordance with the features of this invention, there is provided a method of producing a delay line device. In a first step, a plurality of first greensheets each having an unbaked grounding electrode on an upper surface thereof and a plurality of second greensheets each having an unbaked strip-line conductor are alternately accumulated in the manner that two of the first greensheets come in uppermost and lowermost positions. In a second step, a third greensheet having no metal layer thereon is accumulated on the first greensheet in the uppermost position, whereby to produce a lamination. In a third step, unbaked external input and output electrodes and an external grounding electrode are formed on a side surface of the lamination. In a fourth step, the lamination is baked together with the external electrodes. The strip-line conductors are connected in series through a via hole made in the lamination to form a strip-line conductor series, and both ends of the strip-line conductor series are extended onto the side surface of the lamination to be connected to the external input and output electrodes respectively, and connecting portions of the grounding electrodes are extended onto the side surface of the lamination to be connected to the external grounding electrode.

The first step may be a repetition of a procedure of printing the grounding electrode on the upper surface of one of the first greensheets, laminating one of the second greensheets on the grounding electrode, printing the strip-line conductor on the upper surface of the above one of the second greensheets, and laminating another one of the first greensheets on the strip-line conductor.

The first greensheets except the greensheets in the uppermost and the lowermost positions may each have a hole punched at a portion thereof having no grounding electrode, and the second greensheets except for the greensheet laminated on the first greensheet in the lowermost position may each have a hole punched and then have the strip-line conductor printed thereon, whereby the holes of the greensheets interposed between two of the strip-line conductors are filled with a conducting material of the strip-line conductors and thus the above two strip-line conductors are electrically connected.

The lamination may be baked before the unbaked external input, output and grounding electrodes are formed on the side surface thereof. In such a case, the external electrodes are baked after being formed on the side surface of the lamination.

According to the above method, connecting positions of the strip-line conductors and the grounding electrodes are extended onto a specified side of the lamination. Therefore, the greensheets are aligned and the external electrodes are formed at appropriate positions both with great ease by using the connecting portions as marks. This remarkably improves the manufacturing precision.

The greensheets are easily prepared because many holes are not necessary.

Since the grounding electrodes are connected through the external grounding electrodes which are formed by baking, the manufacturing efficiency is enhanced and the wiring is simplified.

The dielectric layers are pressed with no use of binder, it the binder does not change the capacity between the strip-line conductors and the grounding electrodes.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawings.

DESCRIPTION OF A PREFERRED EMBODIMENT

Figure 1:
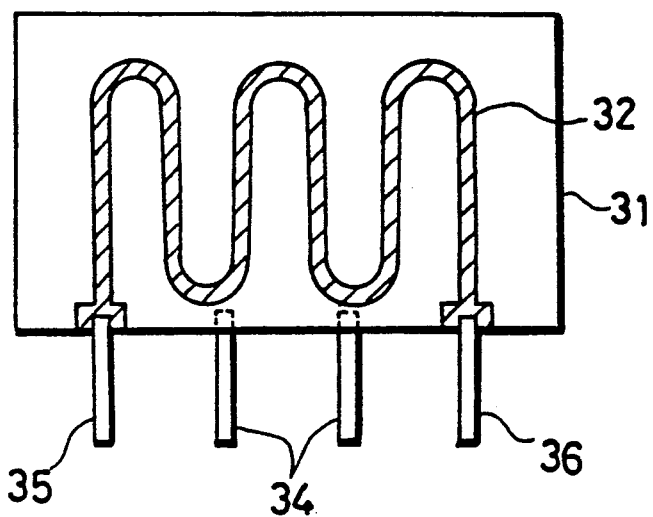
FIG. 1 is a front view of a conventional delay line device.
Figure 2:
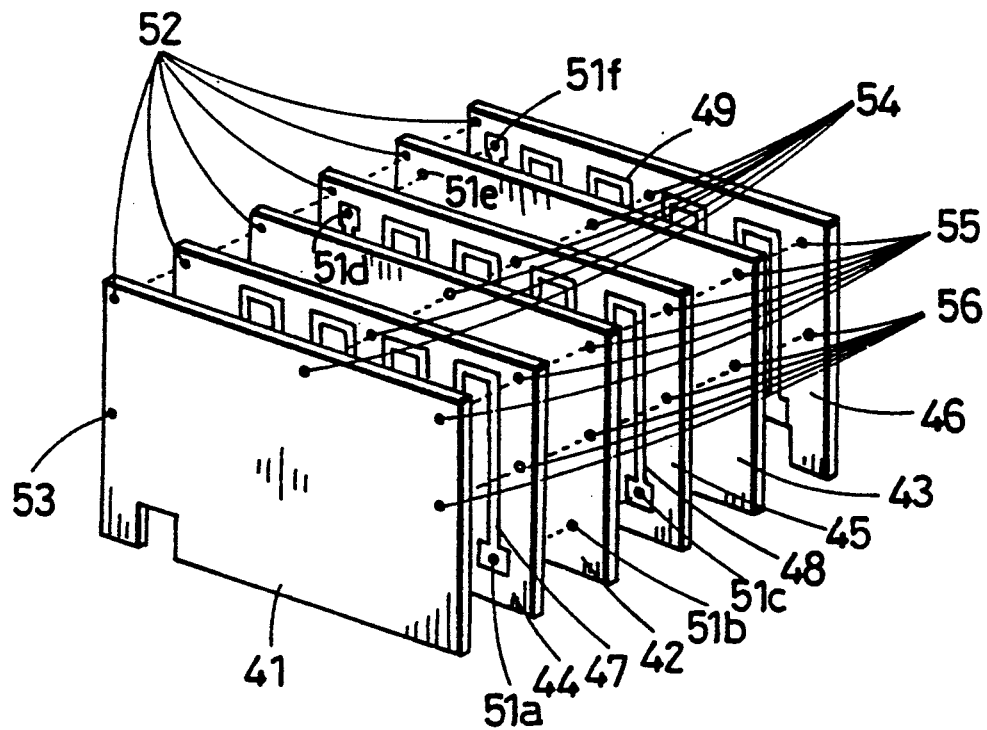
FIG. 2 is an exploded perspective view of another conventional delay line device.
Figure 3:
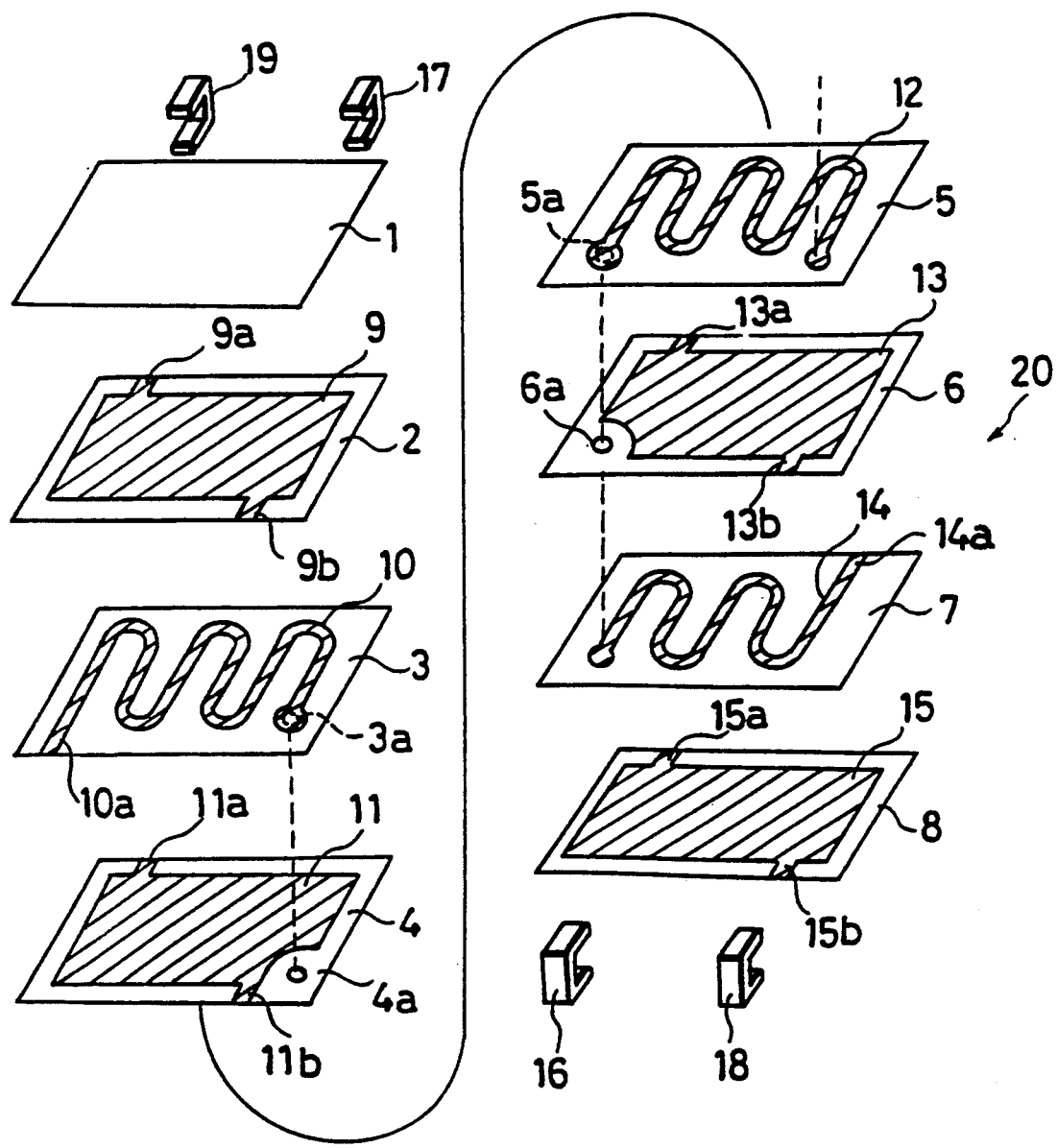
FIG. 3 is an exploded perspective view of a delay line device as an embodiment according to this invention.
Figure 4:
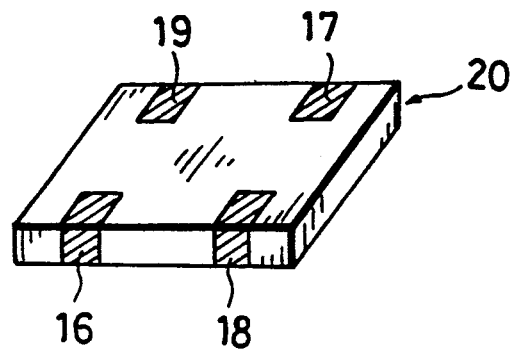
FIG. 4 is a perspective outer view of the delay line device as the embodiment.

FIG. 3 shows a delay line device as an embodiment according to this invention. The delay line device comprises a lamination 20 formed of eight dielectric layers 1 through 8 accumulated from top to bottom. The lamination 20 has external input electrode 16, an external output electrode 17, and two external grounding electrodes 18 and 19 on upper, bottom and side surfaces thereof. The lamination 20, and the electrodes 16 through 19 are integrated as one body as shown in FIG. 4. The dielectric layers 1 through 8 are formed of, for example, ceramics.

The dielectric layer 2 has a grounding electrode 9 on an upper surface thereof. The dielectric layer 3 has a hole 3a at a corner thereof and a strip-line conductor 10 on an upper surface thereof. The dielectric layer 4 has a hole 4a at a corner thereof and a grounding electrode 11 on an upper surface thereof. The dielectric layer 5 has a hole 5a at a corner thereof and a strip-line conductor 12 on an upper surface thereof. The dielectric layer 6 has a hole 6a at a corner thereof and a grounding electrode 13 on an upper surface thereof. The dielectric layer 7 has a strip-line conductor 14 on an upper surface thereof. The dielectric layer 8 has a grounding electrode 15 on an upper surface thereof.

The grounding electrodes 9, 11, 13 and 15, the strip-line conductors 10, 12 and 14 and the external electrodes 16 through 19 are formed of copper.

The grounding electrodes 9, 11, 13 and 15 respectively have two connecting portions 9a and 9b, 11a and 11b, 13a and 13b, and 15a and 15b. The connecting portions are extended onto the side surfaces of the lamination 20 to be connected to the external grounding electrodes 18 and 19.

The grounding electrodes 11 and 13 are cut off at corners thereof to save spaces for the holes 4a and 6a.

The strip-line conductors 10, 12 and 14 are meandering.

The strip-line conductors 10 and 14 have connecting portions 10a and 14a extended onto the side surfaces of the lamination 20. The connecting portion 10a is connected to the external input electrode 16, and the connecting portion 14a is connected to the external output electrode 17.

As the dielectric layers 1 through 8 are pressed, the holes 3a and 4a are filled with a conducting material of the strip-line conductors 10, wherein the strip-line conductors 10 and 12 are electrically connected. In the same way, the holes 5a and 6a are filled with a conducting material of the strip-line conductor 12, wherein the strip-line conductors 12 and 14 are electrically connected. In other words, the strip-line conductors 10, 12 and 14 are connected in series via a through hole made of the holes 3a and 4a and another through hole made of the holes 5a and 6a.

In such a construction, the grounding electrode 15, the dielectric layer 7, the strip-line conductor 14, the dielectric layer 6 and the grounding electrode 13 form a first strip line. The grounding electrode 13, the dielectric layer 5, the strip-line conductor 12, the dielectric layer 4 and the grounding electrode 11 form a second strip line. The grounding electrode 11, the dielectric layer 3, the strip-line conductor 10, the dielectric layer 2 and the grounding electrode 9 form a third strip line. Since the strip-line conductors 10, 12 and 14 are connected, the three strip lines are connected in series.

Since the connected strip-line conductors acts as a signal line, a long signal line can be formed in a compact construction. Since a delay time is in proportion with the length of the signal line, a long delay time can be obtained with a compact delay line device.

Since the grounding electrodes 9, 11, 13 and 15 are connected through the connecting portions 9a, 9b, 11a, 11b, 13a, 13b, 15a and 15b and the external grounding electrodes 18 and 19, there is no necessity of making many holes in the dielectric layers 1 through 8. This is also a great contribution to the compactness of the delay line device.

The high frequency characteristic is excellent since the external input and output electrodes 16 and 17 have no extra inductances.

How to produce such a delay line device will be described hereinafter.

Eight ceramic greensheets are prepared to be turned into dielectric layers 1 through 8. (The greensheets, which are respectively to be turned into the dielectric layers 1 through 8, will be referred to as the greensheets 1 through 8 for convenience in explanation.)

The greensheets 3, 4, 5 and 6 are punched with, for example, an NC punch at specified positions to make the holes 3a, 4a, 5a and 6a.

The grounding electrodes 9, 11, 13 and 15 are respectively formed on upper surfaces of the greensheets 2, 4, 6 and 8. The strip-line conductors 10, 12 and 14 are respectively formed on upper surfaces of the greensheets 3, 5 and 7. The grounding electrodes and the strip-line conductors are formed by printing or the like.

The greensheets 1 through 8 are accumulated in this order from top to bottom and pressed to obtain the lamination 20. The connecting portions 9a, 9b, 11a, 11b, 13a, 13b, 15a and 15b can be used as marks for aligning the layers. When the layers are pressed, the conducting materials of the strip-line conductors 10 and 12 respectively go into the holes 3a and 4a, and 5a and 6a until being blocked by the strip-line conductors 12 and 14, whereby connecting the strip-line conductors 10, 12 and 14 in series.

The external input electrode 16, the external output electrode 17, and the two external grounding electrodes 18 and 19 are formed on the lamination 20 by, for example, printing, and the lamination 20 and the electrodes 16 through 19 are baked into one body as shown in FIG. 4.

According to the above method, the grounding electrodes 9, 11, 13 and 15 are easily aligned by using the connecting portions 9a, 9b, 11a, 11b, 13a, 13b, 15a and 15b as marks.

Since the connection of grounding electrodes 9, 11, 13 and 15 does not require many holes in each greensheet, the greensheets are easily prepared.

Since the layers are pressed with no use of a binder, the capacity between the strip-line conductors and the grounding electrodes is not fluctuated. Accordingly, the high frequency characteristic can be kept excellent.

Figure 5:
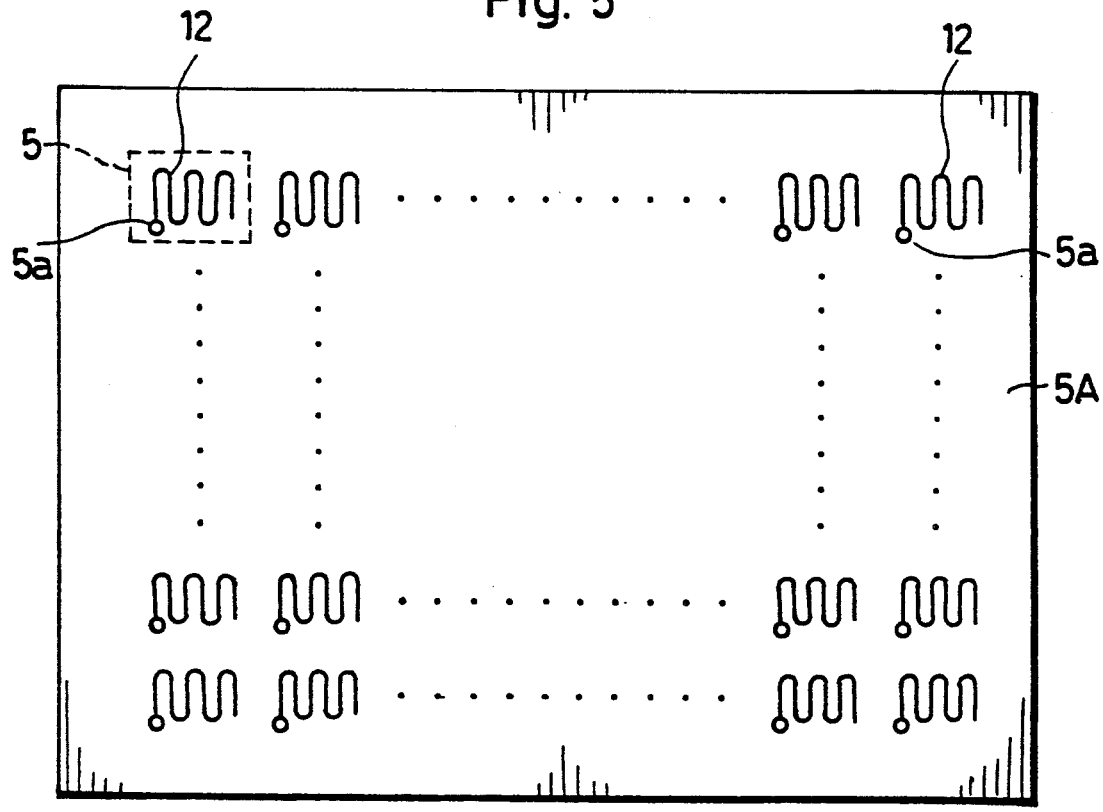
FIG. 5 is a plan view of a greensheet which may be used for the delay line device according to this invention.

FIG. 5 shows a large greensheet 5A which is used for massproduction of the delay line device. The greensheet 5A has a plurality of strip-line conductors 12 of the same pattern formed thereon. The greensheet 5A is cut along the dashed lines into multiple sheets.

Figure 6:
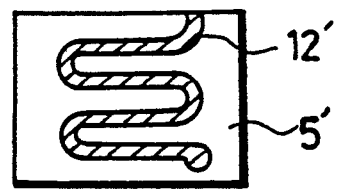
FIG. 6 is a strip-line conductor which may be used for a first modification of the embodiment.

In the above embodiment, three strip-line conductors are connected in series. However, the strip-line conductors may be connected in any number of two or more in accordance with the desirable delay time. If two strip-line conductors are to be connected, one of the conductors may be as the one as shown with 12' formed on a dielectric layer 5' (FIG. 6). The strip-line conductors may be in a meandering shape appropriate for the desirable delay time. The strip-line conductors may be spiral.

Although the strip-line conductors, the grounding electrodes and the external electrodes are formed of copper, they may be formed of silver or a silver-palladium alloy.

Figure 7:
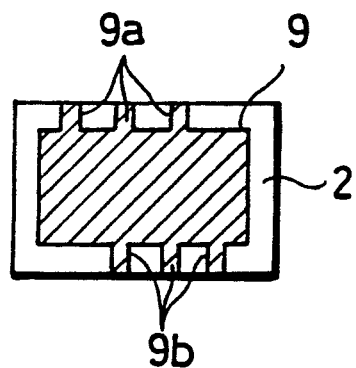
FIG. 7 is a plan view of a ground electrode as used for a second modification of the embodiment.
Figure 8:
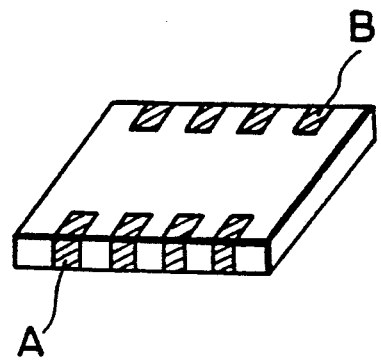
FIG. 8 is a perspective outer view of the second modification.

The grounding electrodes may be the one shown in FIG. 7, in which the grounding electrodes are connected through six connecting portions instead of two. The more portions the grounding electrodes are connected through, the more excellent the high frequency characteristic is. In such a delay line device, an input and an output terminals are at A and B of FIG. 8.

Figure 9:
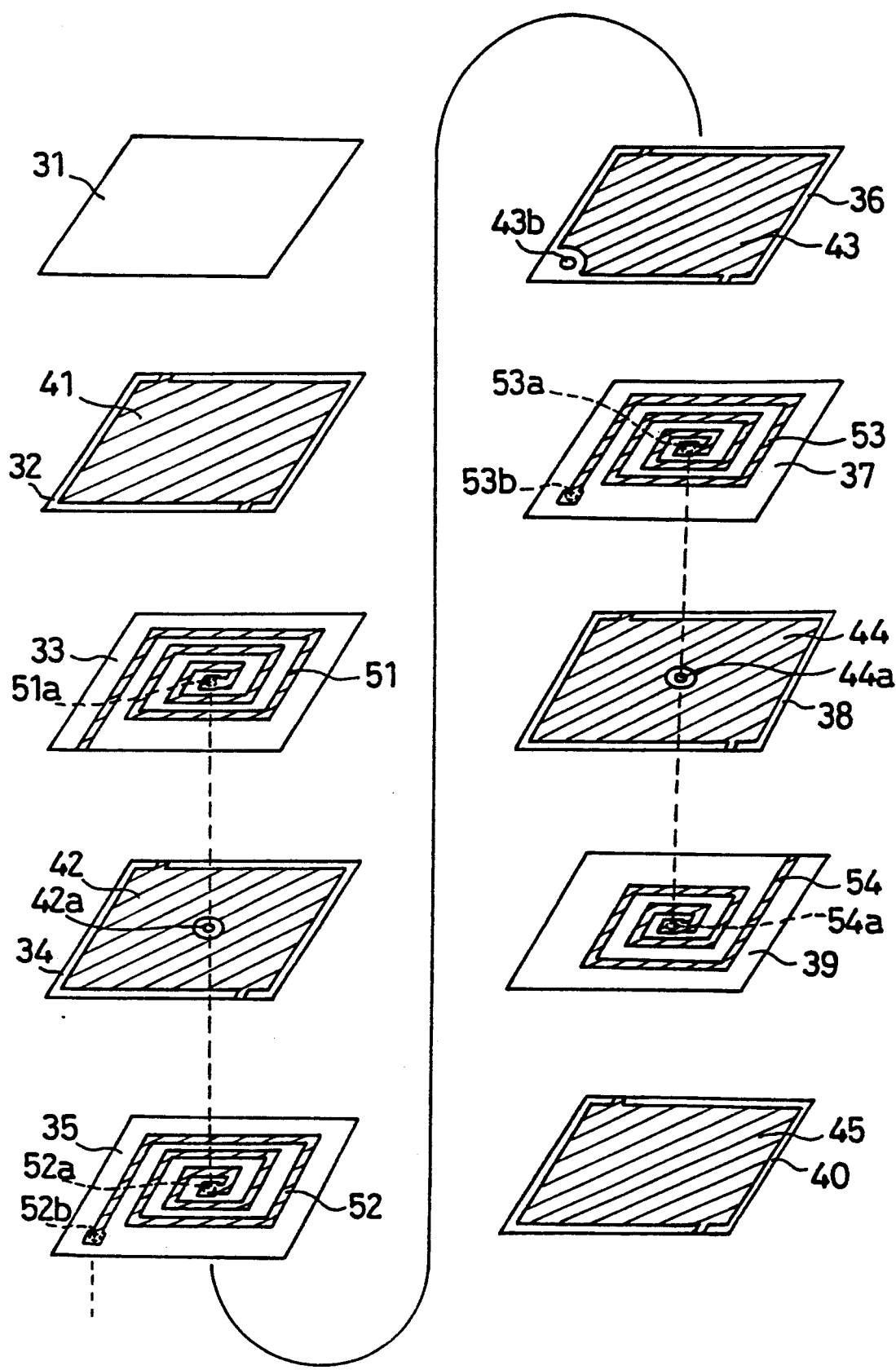
FIG. 9 is an exploded perspective view of a modification Of the above embodiment.

The strip-line conductors may be spiral as shown in FIG. 9 instead of meandering. In FIG. 9, the delay line device comprises dielectric layers 31 through 40, grounding electrodes 41 through 45 and strip-line conductors 51 through 54. The spiral strip-line conductors can be employed in even numbers. The strip-line conductors are connected in series through holes 51a, 42a, 52a, 52, 43b, 53b, 53a, 44a and 54a.

Although the present invention has been fully described by way of an embodiment with references to the accompanying drawings, it is to be noted that various changes and modifications will be apparent to those skilled in the art. Therefore, unless such changes and modifications depart from the scope of the present invention, they should be construed as being included therein.

What is claimed is:

1. A delay line device for delaying signal transmission comprising:
    a lamination comprising an uppermost grounding electrode, a lowermost grounding electrode, a plurality of strip-line conductors and a plurality of intermediate grounding electrodes which are accumulated alternately and are interposed between the uppermost and the lowermost grounding electrodes, dielectric layers each interposed between each adjacent pair of the strip-line conductor and the intermediate grounding electrode, and protective layers respectively provided on outer surfaces of the uppermost and the lowermost grounding electrodes, the strip-line conductors being connected a via a through hole to form a strip-line conductor series, and both ends of the strip-line conductor series being extended onto a side surface of said lamination;
    an external input electrode connected to one of the ends of the strip-line conductor series on the side surface of said lamination;
    an external output electrode connected to the other end of the strip-line conductor series on the side surface of said lamination; and
    an external grounding electrode connected to connecting portions of the uppermost, lowermost and said intermediate grounding electrodes on the side surface of said lamination.

2. A delay line device of claim 1, wherein the strip-line conductors, the grounding electrodes and said external electrodes are formed of a metal selected from a group consisting of copper, silver and a silver-palladium alloy, and the dielectric layers and protective layers are formed of ceramics, the strip-line conductors, the grounding electrodes, dielectric layers and said external electrodes being baked to be integrated into one body.

3. A delay line device of claim 2, wherein the grounding electrodes each have a surface area which is a little smaller than a surface area of a main surface of the dielectric layer, and each said intermediate grounding electrode is shaped so as not to cover a portion of the dielectric layer immediately below the intermediate grounding electrode, the portion having a hole.

4. A delay line device of claim 3, wherein the dielectric layer immediately below each strip-line conductor has a hole, and two of the strip-line conductors which are adjacent to each other with one of the grounding electrodes interposed therebetween are electrically connected through a via hole, the via hole being formed of the holes of the dielectric layers interposed between the above two strip-line conductors.

5. A delay line device of claim 4, wherein the strip-line conductors are meandering in accordance with a desirable delay time.

6. A delay line device of claim 5, wherein said lamination comprises another external grounding electrode, one of the external grounding electrodes being formed on one of the side surfaces of said lamination together with said external input electrode and the other of the external grounding electrodes being formed on the side surface opposed to the above one side surface together with said external output electrode.

7. A delay line device of claim 6, wherein said external electrodes are formed on the side surfaces of said lamination in the manner that a line connecting said external grounding electrodes and a line connecting said external input electrode and said external output electrode are diagonal.

8. A delay line device of claim 4, wherein the strip-line conductors are spiral.

9. A method of producing a delay line device comprising:
    a first step of alternately accumulating a plurality of first greensheets each having an unbaked grounding electrode on an upper surface thereof and a plurality of second greensheets each having an unbaked strip-line conductor, in the manner that two of the first greensheets come in uppermost and lowermost positions;
    a second step of accumulating a third greensheet having no metal layer thereon on the first greensheet in the uppermost position, whereby to produce a lamination;
    a third step of forming unbaked external input and output electrodes and an external grounding electrode on a side surface of the lamination; and
    a fourth step of baking the lamination together with the external electrodes;
    wherein the strip-line conductors are connected in series via a through hole made in the lamination to form a strip-line conductor series, and both ends of the strip-line conductor series are extended onto the side surface of the lamination to be connected to the external input and output electrodes respectively, and connecting portions of the grounding electrodes are extended onto the side surface of the lamination to be connected to the external grounding electrode.

10. A method of claim 9, wherein the first step is a repetition of a procedure of printing the grounding electrode on the upper surface of one of the first greensheets, laminating one of the second greensheets on the grounding electrode, printing the strip-line conductor on the upper surface of the above one of the second greensheets, and laminating another one of the first greensheets on the strip-line conductor.

11. A method of claim 10, wherein the first greensheets except the greensheets in the uppermost and the lowermost positions each have a hole punched at a portion thereof having no grounding electrode, and the second greensheets except for the greensheet laminated on the first greensheet in the lowermost position each have a hole punched and then have the strip-line conductor printed thereon, whereby the holes of the greensheets interposed between two of the strip-line conductors are filled with a conducting material of the strip-line conductors and thus the above two strip-line conductors are electrically connected.

12. A method of producing a delay line device, comprising:
   a first step of alternately accumulating a plurality of first greensheets each having an unbaked grounding electrode on an upper surface thereof and a plurality of second greensheets each having an unbaked strip-line conductor in the manner that two of the first greensheets come in uppermost and lowermost positions;
   a second step of accumulating a third greensheet having no metal layer thereon on the first greensheet in the uppermost position, whereby to produce a lamination;
   a third step of baking the lamination;
   a fourth step of forming unbaked external input and output electrodes and an external grounding electrode on a side surface of the baked lamination; and
   a fifth step of baking the lamination together with the external electrodes;
   wherein the strip-line conductors are connected in series through a via hole made in the lamination to form a strip-line conductor series, and both ends of the strip-line conductor series are extended onto the side surface of the lamination to be connected to the external input and output electrodes, respectively.

13. A method of claim 12, wherein the first step is a repetition of a procedure of printing the grounding electrode on the upper surface of one of the first greensheets, laminating one of the second greensheets on the grounding electrode, printing the strip-line conductor on the upper surface of the above one of the second greensheets, and laminating another one of the first greensheets on the strip-line conductor.

14. A method of claim 13, wherein the first greensheets except the greensheets in the uppermost and the lowermost positions each have a hole punched at a portion thereof having no grounding electrode, and the second greensheets except for the greensheet laminated on the first greensheet in the lowermost position each have a hole punched and then have the strip-line conductor printed thereon, whereby the holes of the greensheets interposed between two of the strip-line conductors are filled with a conducting material of the strip-line conductors and thus the above two strip-line conductors are electrically connected.

15. A delay line device of claim 1, wherein connecting portions of the grounding electrodes are extended onto the side surface of the lamination to be connected to the external grounding electrode.

* * * * *